United States Patent [19]

Yagi

[11] Patent Number: 4,680,768
[45] Date of Patent: Jul. 14, 1987

[54] SEMICONDUCTOR LASER WITH A QUANTUM WELL LAYER INCLUDING A DISORDERED REGION

[75] Inventor: Katsumi Yagi, Osaka, Japan
[73] Assignee: Sanyo Electric Co., Ltd., Japan
[21] Appl. No.: 755,079
[22] Filed: Jul. 15, 1985

[30] Foreign Application Priority Data

Jul. 19, 1984 [JP] Japan ............................ 59-149954

[51] Int. Cl.$^4$ ............................................. H01S 3/19
[52] U.S. Cl. ...................................... 372/45; 357/17; 372/44; 372/46
[58] Field of Search ...................... 372/45, 46, 43, 44; 357/17

[56] References Cited

U.S. PATENT DOCUMENTS

| | | | |
|---|---|---|---|
| 3,978,428 | 8/1976 | Burnham et al. | 372/44 |
| 4,033,796 | 7/1977 | Burnham et al. | 148/175 |
| 4,594,603 | 6/1986 | Holonyak, Jr. | 372/42 |

FOREIGN PATENT DOCUMENTS

| | | | |
|---|---|---|---|
| 52-261976 | 1/1976 | Japan | 3/18 |
| 0068689 | 5/1980 | Japan | 372/46 |

OTHER PUBLICATIONS

Yonezu et al., "New Stripe Geometry Laser with High Quality Lasing Characteristics by Horizontal Transverse Mode Stabilization—A Refractive Index Guiding with Zn Doping, Japan J. Appl. Phys., vol. 16, Jan. 1977, No. 1, 209–210.

W. D. Laidig et al, "Disorder of an AlAs–GaAs Superlattice by Impurity Diffusion", Appl. Phys. Lett. 38 (10), 15 May 1981—pp. 776–778.

Primary Examiner—James W. Davie
Assistant Examiner—Georgia Y. Epps
Attorney, Agent, or Firm—Darby & Darby

[57] ABSTRACT

A semiconductor laser includes an active layer (13) for oscillating a laser beam, a first clad layer (12) and a second clad layer (14) stacked to hold the active layer (13), a QW layer (15) stacked on the second clad layer (14) and a diffusion portion (17) formed in the central portion of the QW layer (15) by impurity diffusion. Thickness of the second clad layer (14) is so selected that a beam generated from the active layer (13) can penetrate into the second clad layer (14). The QW layer (15) absorbs the beam generated from the active layer (13), while the diffusion layer (17) in the central portion thereof functions as a non-absorption region with respect to the beam. Thus, implemented is a horizontal optical confinement substantially equivalent to CSP structure.

18 Claims, 15 Drawing Figures

RELATION BETWEEN DEPTH AND TIME OF DIFFUSION

SEMICONDUCTOR LASER WITH A QUANTUM WELL LAYER INCLUDING A DISORDERED REGION

BACKGROUND OF THE INVENTION

1. Field of the Invention

The present invention relates to a semiconductor laser.

2. Description of the Prior Art

Various types of semiconductor lasers are proposed in the art for attaining a horizontal optical confinement in active regions.

For example, U.S. Pat. Nos. 3,978,428 and 4,033,796 and Japanese patent publication gazette No. 5273/1979 disclose a channeled substrate planar (CSP) structure. In such structure, both sides of an active layer are held by first and second clad layers, at least one of which has a thick central portion and thin end portions so as to penetrate a laser beam generated from both ends of the active layer through the thin portions of the clad layer to be absorbed by an optical absorption layer provided on the outer side of the clad layer, thereby to horizontally confine the laser beam.

In such structure, however, grooves must be formed in a substrate in order to vary the thickness of the clad layer or a clad layer once grown must be removed by etching.

A report by W. D. Laiding et al. in Appl. Phys. Lett. 38(10), May 15, 1981, pp. 776–778 describes that in quantum-well layer, a portion in which Zn (zinc) is diffused is different in band gap energy from that having no Zn diffusion.

SUMMARY OF THE INVENTION

A semiconductor laser according to the present invention comprises an active layer for substantially oscillating a laser beam, first and second clad layers for holding the active layer which are larger in band gap energy and smaller in optical refractive index than the active layer and a QW (quantum well) layer in quantum-well structure provided on a plane opposite to the surface of either the first or second clad layer being in contact with the active layer and having disordered and non-disordered portions.

In such structure, the disordered portion in the QW layer functions as a non-absorption region with respect to a laser beam generated from the active layer while the non-disordered portion can serve as an absorption region, whereby an effective horizontal optical confinement is substantially obtained as in the aforementioned semiconductor laser in the CSP structure.

According to the present invention, an optical confinement in the active layer can be attained without changing thickness of the clad layer.

The above and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
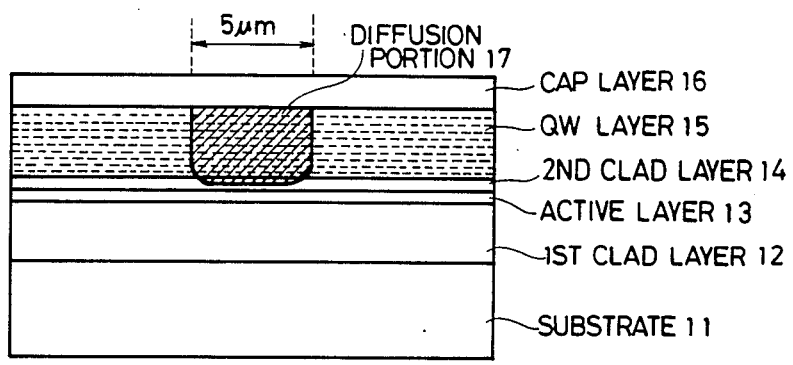
FIG. 1 is a cross-sectional view of a first embodiment of the present invention.

FIG. 1 is a highly simplified cross-sectional view of a first embodiment of the present invention. A semiconductor laser 10 as shown in FIG. 1 is formed by an n-type GaAs substrate 11 and a first clad layer 12, an active layer 13, a second clad layer 14, a QW (quantum well) layer 15 and a cap layer 16 sequentially stacked thereon.

The first clad layer 12 is formed by n-type $Ga_{0.55}Al_{0.45}As$ in which Sn is doped, and has carrier density of $5 \times 10^{17}/cm^3$ and thickness of 1 $\mu$m. The active layer 13 is formed by non-doped $Ga_{0.85}Al_{0.15}As$, and thickness thereof is 0.1 $\mu$m. The second clad layer 14 is formed by p-type $Ga_{0.55}Al_{0.45}As$ with doping of Be, and has carrier density of $5 \times 10^{17}/cm^3$ and thickness of 0.2 $\mu$m. The QW layer 15 is formed by a plurality of alternately stacked n-type GaAs layers having thickness of 60 Å and carrier density of 2 to $5 \times 10^{17}/cm^3$ and n-type AlAs layers having thickness of 70 Å and carrier density of $5 \times 10^{17}/cm^3$, and thickness thereof is about 1 $\mu$m. The cap layer 16 is formed by p-type GaAs with doping of Be, and H has carrier density of $1 \times 10^{19}/cm^3$ and thickness of 0.5 $\mu$m.

A diffusion portion 17 in which Zn (zinc) is diffused is formed, with the width of 5 $\mu$m, in the QW layer 15. The diffusion portion 17 is formed to be elongate and, as shown in FIG. 1, is located at a substantially central portion in terms of the width direction of the QW layer 15, while the same extends in the direction perpendicular to the plane of the sheet of FIG. 1. The diffusion portion 17 is further adapted such that the lower end thereof reaches the second clad layer 14. The diffusion portion 17 is of p-type conductivity with carrier density of $5\times10^{18}/cm^3$, and is substantially equivalent to a $Ga_{0.46}Al_{0.54}As$ layer due to the function of Zn diffusion. Accordingly, the active layer 13 has band gap energy of 1.6 eV, and thus the semiconductor layer 10 can output a laser beam having oscillation wavelength of 780 nm.

Description is now made on a method of manufacturing the semiconductor laser 10.

The first clad layer 12, active layer 13, second clad layer 14 and QW layer 15 are sequentially stacked on one principal surface of the substrate 11 by an MBE (molecular beam epitaxy) method. Under specific conditions, the substrate 11 is retained at a temperature of 700° C. under ultra-high vacuum in the background degree of vacuum less than $10^{-10}$ Torr to grow the respective layers with cells evaporating respective components under the following temperature conditions:

(1) First clad layer 12
   Ga cell: 950° C.
   As cell: 300° C.
   first Al cell: 1100° C.
   first Sn cell: 750° C.
   speed of growth: 1.82 μm/h
(2) Active layer 13
   Ga cell: 950° C.
   As cell: 300° C.
   second Al cell: 1050° C.
   speed of growth: 1.18 μm/h
(3) Second clad layer 14
   Ga cell: 950° C.
   As cell: 300° C.
   first Al cell: 1100° C.
   first Be cell: 800° C.
   speed of growth: 1.82 μm/h
(4) QW layer 15

The QW layer 15 is formed by n-type GaAs layers and n-type AlAs layers as described above, and the conditions of formation of the respective layers are as follows:

(4-1) n-type GaAs layer
   Ga cell: 950° C.
   As cell: 300° C.
   first Sn cell: 750° C.
   speed of growth: 1.00 μm/h
(4-2) n-type AlAs layer
   first Al cell: 1100° C.
   first Sn cell: 750° C.
   As cell: 300° C.
   speed of growth: 0.82 μm/h Then Zn is diffused from the surface of the QW layer 15 to form the diffusion portion 17 in the sequence as shown in FIG. 2.

First, the surface of the QW layer 15 is subjected to $Si_3N_4$ deposition by a CVD method (FIG. 2(i)) under the following conditions:
   $SiH_4$: 0.7 l/min
   $NH_3$: 0.25 l/min
   Ts: 300° C.
   power: 30 W
   thickness: 800 Å (10 min)

Figure 2:
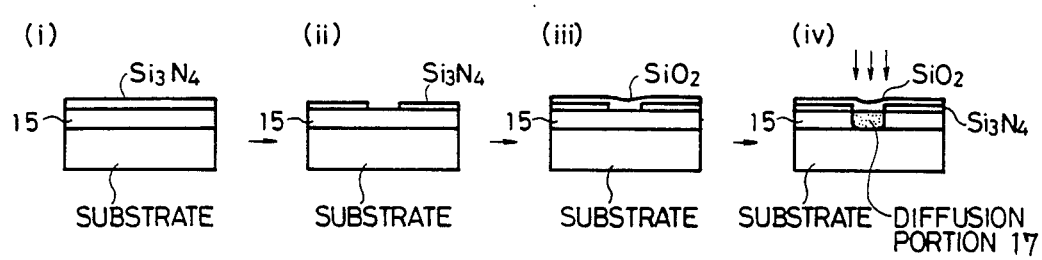
FIG. 2 illustrates sequence of Zn diffusion in a CVD method.

Then $Si_3N_4$ deposited on the portion corresponding to the diffusion portion 17 is removed by photoetching (FIG. 2(ii)).

Thereafter $SiO_2$ is deposited by the CVD method for controlling diffusion density of Zn (FIG. 2(iii)). The density of Zn is reduced to $5\times10^{18}/cm^3$ by the said $SiO_2$ deposition, under the following conditions:
   $SiH_4$: 450 cc/min
   $O_2$: 250 cc/min
   Ts: 430° C.
   thickness: 5000 Å (10 min)

Figure 3:
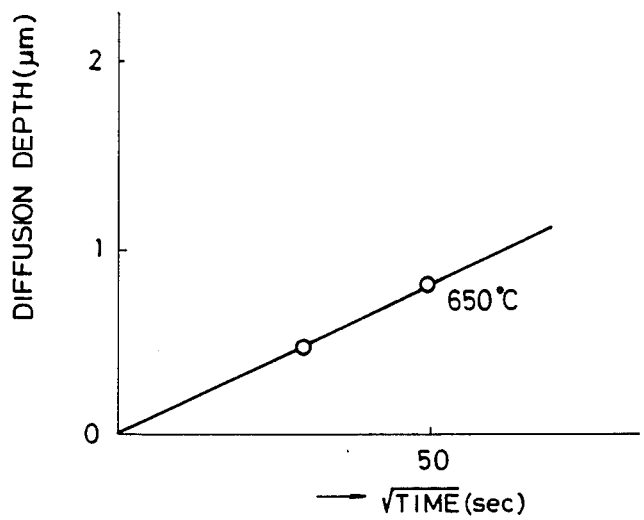
FIG. 3 shows the relation between the time and depth of diffusion.

Finally Zn diffusion is performed (FIG. 2(iv)) with a source of an alloy in the mole ratio of Ga:As:Zn=5:50:45 under a temperature of 650° C. Relation between the time and depth of Zn diffusion is as shown in FIG. 3, and the diffusion time is so controlled as to obtain desired diffusion depth.

Then the deposited $SiO_2$ and $Si_3N_4$ are removed.

Thereafter the cap layer 16, i.e., the uppermost layer is formed by the aforementioned MBE method under the following conditions:
   Ga cell: 950° C.
   As cell: 300° C.
   second Be cell: 850° C.

Although the MBE method is employed in this embodiment to accurately control the thickness of the respective layers, other well-known growth methods such as an LPE (liquid phase epitaxy) method and an MOCVD (metal organic chemical vapor deposition) method may be employed for forming relatively thick first and second clad layers 12 and 14, active layer 13 and cap layer 16.

Description is now made on the function and characteristics of the semiconductor laser 10.

In the semiconductor laser 10 as shown in FIG. 1, the first and second clad layers 12 and 14 are greater in band gap energy (greater in Al mole ratio) than the active layer 13, and hence injected electrons and holes are efficiently confined in the active layer 13, whereby a generated beam is obtained by recombination of the electrons and holes. Such generated beam is confined in the first clad layer 12, since the first clad layer 12 is smaller in optical refractive index than the active layer 13 and larger in thickness of 1 μm. Although, on the other hand, the second clad layer 14 is smaller in optical refractive index than the active layer 13, it has extremely small thickness of 0.2 μm and hence the generated beam is penetrated through the second clad layer 14 to reach the QW layer 15. As hereinabove described, the diffusion portion 17 of the QW layer 15 is equivalent to $Ga_{0.46}Al_{0.54}As$ and is greater in band gap energy than the active layer 13 and larger in thickness of 1 μm, and hence no generated beam is confined in the diffusion portion 17 and the generated beam is not absorbed thereinto. On the other hand, the portion of the QW layer 15 other than the diffusion portion 15 absorbs the generated beam because of absorption characteristic thereof designed to absorb a beam generated in the active layer 13.

Figure 4:
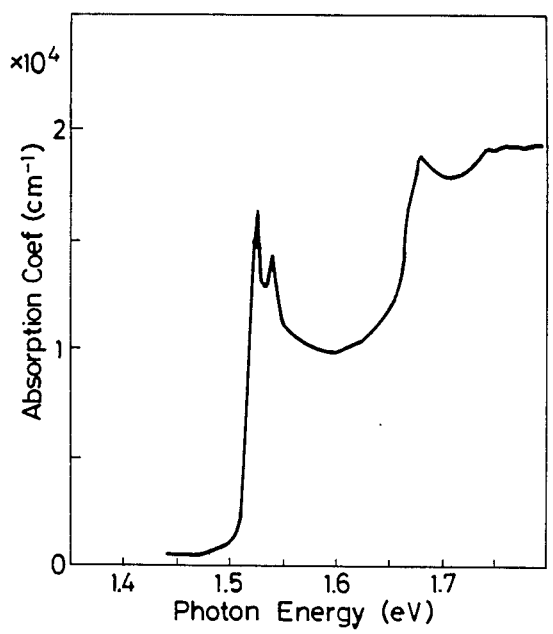
FIG. 4 shows the optical absorption characteristic of a non-diffusion portion of a QW layer 15 in a semiconductor laser 10.

FIG. 4 shows the optical absorption characteristic of the non-diffusion portion of the QW layer 15 in the semiconductor laser 10. It is understood from FIG. 4 that the non-diffusion portion of the QW layer 15 has band gap energy of 1.6 eV and has flat absorption characteristic for the beam of oscillation wavelength 780 nm from the active layer 13 having band gap energy of 1.6 eV.

Thus, in the semiconductor laser 10 according to the present embodiment, the recombined beam generated from the active layer 13 at the portion immediately under the diffusion portion 17 is fficiently confined in the active layer 13 by the diffusion portion 17 and the first clad layer 12, and the beam generated in the active layer 13 at the portion immediately under the QW layer 15 except for the diffusion portion 17 is absorbed by the QW layer 15, whereby a difference is obtained between the refractive index in the portion of the active layer 13 immediately under the diffusion portion 17 and the refractive index in the other portion thereof. Thus, the beam can be horizontally confined in the active layer 13.

It has been experimentally confirmed that thickness h of the second clad layer 14 is t be in the following range:

$$0.2 \ \mu m \leq h \leq 0.6 \ \mu m$$

Figure 5:
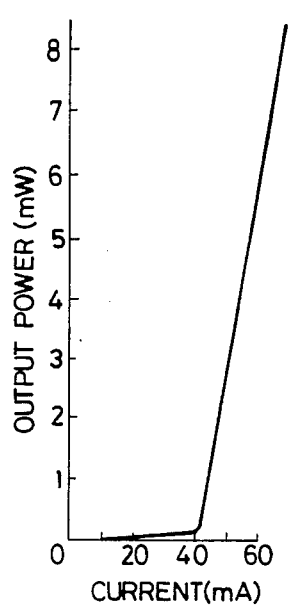
FIG. 5 is an I-P characteristic diagram of the semiconductor laser 10.
Figure 6:
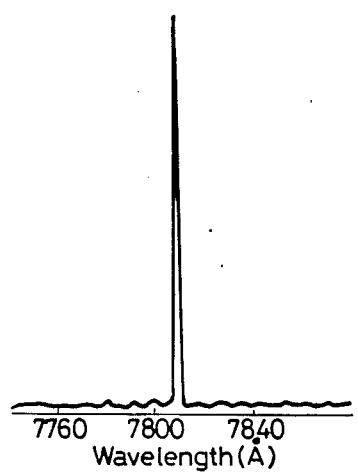
FIG. 6 is an oscillation characteristic diagram of the semiconductor laser 10.
Figure 7:
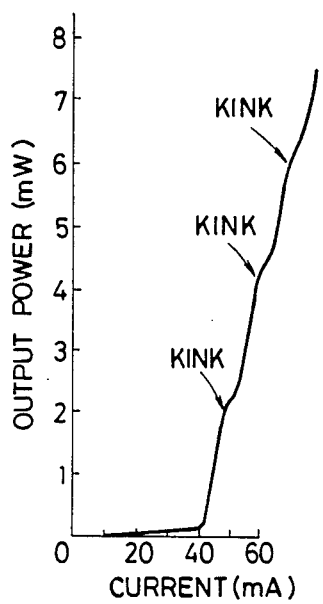
FIG. 7 is an I-P characteristic diagram of the semiconductor laser 10 showing the case where thickness h is out of condition.
Figure 8:
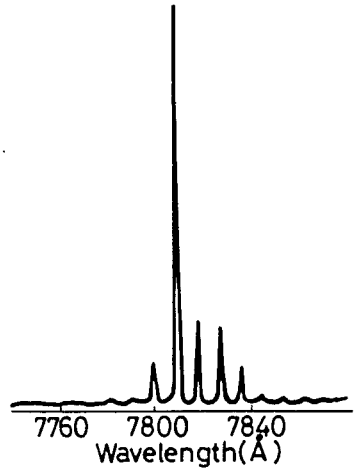
FIG. 8 is an oscillation characteristic diagram of the semiconductor laser 10 showing the case where thickness h is out of condition.

Within the above range of the thickness h of the second clad layer 14, the I-P (current-power) characteristic of the semiconductor laser 10 is obtained in such linearity as shown in FIG. 5 and the oscillation characteristic thereof is obtained in a single mode as shown in FIG. 6. On the other hand, when the thickness h is greater than 0.6 μm, kinks appear in the I-P characteristic of the semiconductor laser 10 as shown in FIG. 7. Further, when the thickness h is less than 0.2 μm, multimode oscillation takes place as shown in FIG. 8. This is based on the fact that the above described difference is substantially required in effective refractive index of about $10^{-4}$ and the thickness h of the second clad layer 14 must be within the aforementioned range in order to obtain the said difference in refractive index.

Embodiment 2

Figure 9:
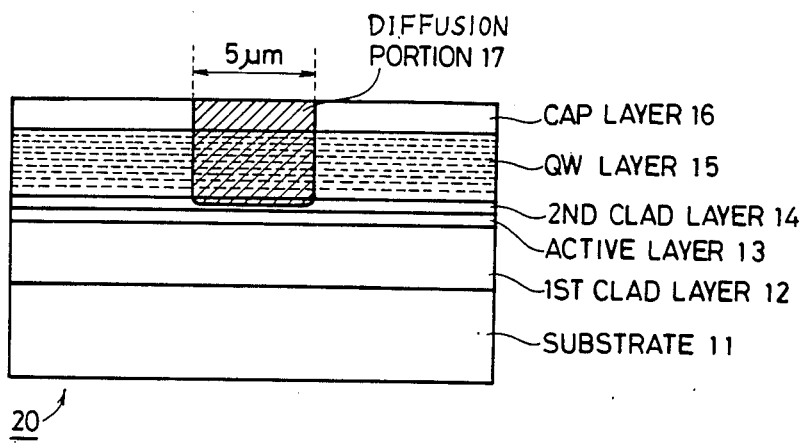
FIG. 9 is a cross-sectional view of a second embodiment of the present invention.

FIG. 9 is a side elevational view showing structure of a second embodiment of the present invention. A semiconductor laser 20 according to the second embodiment comprises a substrate 11 and a first clad layer 12, an active layer 13, a second clad layer 14, a QW layer 15 and a cap layer 16 formed thereon and a diffusion portion 17 thereafter provided in the QW layer 15 and the cap layer 16. In such structure, the layers from the first clad layer 11 to the cap layer 16 can be continuously formed advantageously by, e.g., the MBE method.

In case where Zn is diffused directly from above the QW layer 15, Al in the QW layer 15 comes up on the surface of the diffusion portion of the QW layer 15, whereby a film of aluminum oxide is formed, with the result of a disadvantage that the cap layer 16 is hardly formed; however; such disadvantage is eliminated by the above described embodiment.

The respective layers of the semiconductor laser 20 according to the second embodiment are different in formation from those of the semiconductor laser 10 according to the first embodiment in the following points:

Thickness of the active layer 13 is further reduced from 0.1 μm to 0.06 μm (formation not changed), and the cap layer 16 is formed by n-type GaAs with doping of Sn and the carrier density thereof is 2 to $3 \times 10^{18}/cm^3$. Other factors are completely identical to those of the first embodiment.

The semiconductor laser 20 according to the second embodiment has similar characteristics as those of the first embodiment. Therefore, similarly to the first embodiment, thickness h of the second clad layer 14 must be selected within the following range:

$$0.2 \ \mu m \leq h \leq 0.6 \ \mu m$$

Embodiment 3

A third embodiment of the present invention is a semiconductor laser completely identical in structure to the second embodiment with formation changed as follows:

Active layer 13: formed by non-doped $Ga_{0.9}Al_{0.1}As$ in thickness of 0.08 μm QW layer 15: formed by alternately stacked n-type GaAs layers having carrier density of 2 to $5 \times 10^{17}/cm^3$ and thickness of 85 Å and n-type AlAs layers having carrier density of $5 \times 10^{17}/cm^3$ thickness of 95 Å to be in thickness of about 1 μm Diffusion portion 17: p-type Zn diffusion, substantially equivalent to $Ga_{0.47}Al_{0.53}As$ in QW layer Other factors are identical to those of the second embodiment.

Figure 10:
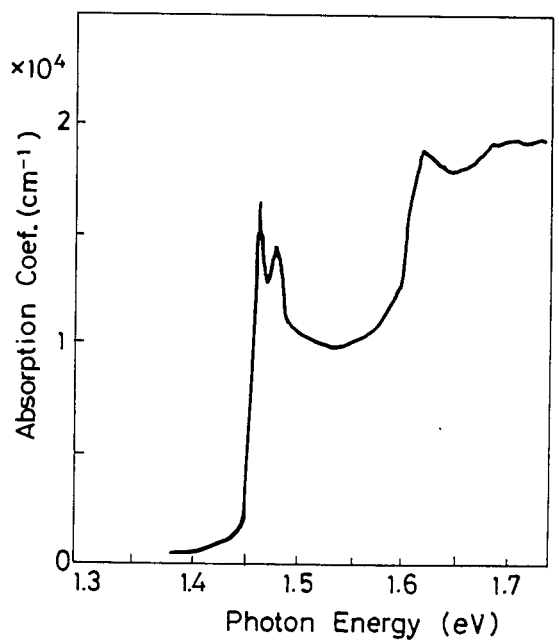
FIG. 10 is an optical absorption characteristic diagram of a non-diffusion portion of a QW layer in a third embodiment of the present invention.

The laser according to the third embodiment has the active layer 13 of band gap energy of 1.55 eV and oscillating a beam of wavelength of 800 nm, and FIG. 10 shows the optical absorption characteristic of the non-diffusion portion of the QW layer 15 thereof.

Figure 11:
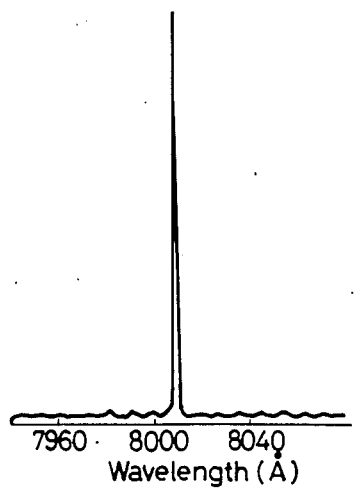
FIG. 11 is an oscillation characteristic diagram of the third embodiment showing the case where thickness h is in condition.
Figure 12:
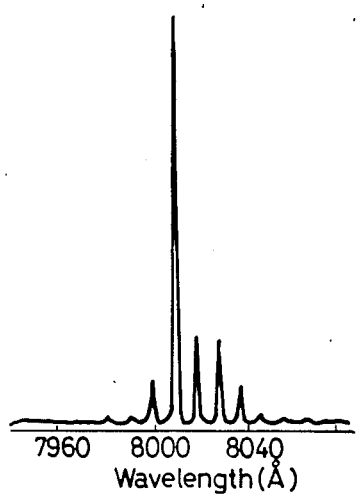
FIG. 12 is an oscillation characteristic diagram of the third embodiment showing the case where thickness h is out of condition.

The third embodiment has similar I-P and oscillation characteristics as the first and second embodiments. Therefore, thickness h of the second clad layer 14 must be selected within a range similar to those in the aforementioned embodiments. FIGS. 11 and 12 are oscillation characteristic diagrams of the third embodiment. FIG. 11 shows the case where thickness h is within the range of (0.2 μm ≤ h ≤ 0.6 μm) and FIG. 12 shows the case where thickness h is out of the above described range.

Embodiment 4

Figure 13:
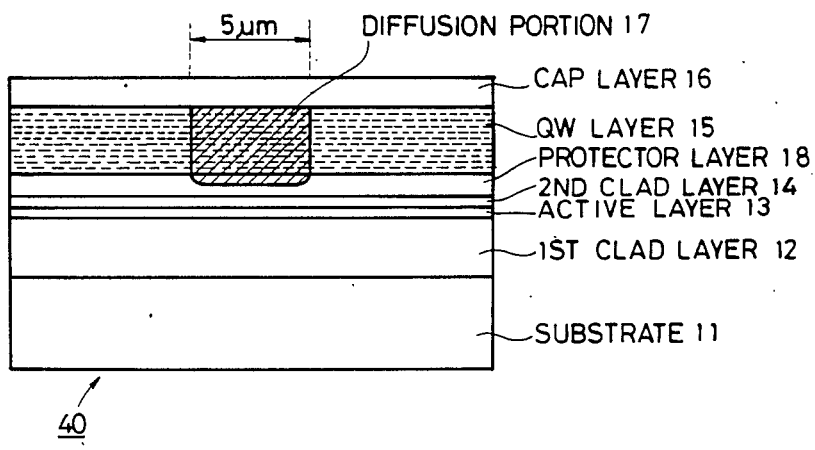
FIG. 13 is a cross-sectional view of a fourth embodiment of the present invention.

FIG. 13 shows a fourth embodiment of the present invention. A semiconductor laser 40 according to the fourth embodiment is characterized in that a protector layer 18 is provided in order to prevent a diffusion portion 17 from reaching a active layer 13.

The protector layer 18 is formed by p-type $Ga_{0.8}Al_{0.2}As$ in thickness of 0.2 μm. The mole ratio of Al may be within the range of 0.2 to 0.25.

Other factors are identical to those of the first embodiment.

The protector layer 18 lower in Al mole ratio than a second clad layer 14 is provided in order to delay the speed of Zn diffusion in the protector layer 18. The depth of Zn diffusion is proportional to the time as hereinabove described with reference to FIG. 3. Therefore, by providing the protector layer 18, the diffusion depth can be easily controlled by time adjustment.

The semiconductor laser 40 according to the fourth embodiment has characteristics similar to that of the first embodiment.

Embodiment 5

Figure 14:
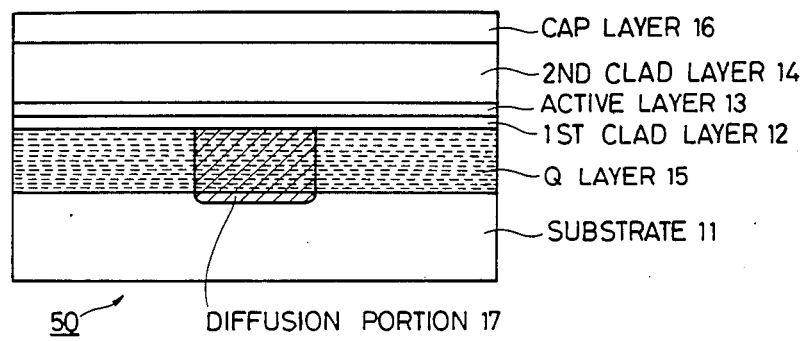
FIG. 14 is a cross-sectional view of a fifth embodiment of the present invention.

FIG. 14 shows a fifth embodiment of the present invention.

In each of the first to fourth embodiments as hereinabove described, it is difficult to control the diffusion depth of the Zn diffusion portion 17, which is apt to reach the active layer 13 whereby no desired characteristic is obtained. Even if the protector layer 18 is provided as in the fourth embodiment, it is still difficult to control the said diffusion depth.

In the fifth embodiment of the present invention, an improvement is made in the aforementioned point so that an active layer 13 is not influenced by the diffusion depth of a diffusion portion 17.

Referring to FIG. 14, a semiconductor laser 50 according to the fifth embodiment comprises a p-type GaAs substrate 11 and a QW layer 15, a first clad layer 12, the active layer 13, a second clad layer 14 and a cap layer 16 sequentially stacked thereon. Similarly to the first and fourth embodiment, the diffusion portion 17 in which Zn (zinc) is diffused is formed, with the width of 5 μm, in the QW layer 15. The diffusion portion 17 is formed to be elongate and, as shown in FIG. 14, is located at a substantially central portion in terms of the width direction of the QW layer 15, while the same extends in the direction perpendicular to the plane of the sheet of FIG. 14. The diffusion portion 17 is further adapted such that the lower end thereof reaches the second clad layer 14.

The respective layers are formed as follows:

First clad layer 12: formed by p-type $Ga_{0.55}Al_{0.45}As$ with dopant of Be in carrier density of $5 \times 10^{17}/cm^3$ and thickness of 0.1 μm Second clad layer 14: formed by n-type $Ga_{0.55}Al_{0.45}As$ with dopant of Sn in carrier density of $5 \times 10^{17}/cm^3$ and thickness of 1 μm Cap layer 16: formed by n-type GaAs with dopant of Sn in carrier density of $2$ to $3 \times 10^{18}/cm^3$ The active layer 13 and QW layer 15 are in the same formation as those in the first embodiment.

In such structure, no problem is caused by development of diffusion of the diffusion portion 17 in the substrate 11, and the diffusion of the diffusion portion 17 can be readily controlled.

The semiconductor laser 50 according to the fifth embodiment has the same characteristics as those of the first embodiment.

Embodiment 6

Figure 15:
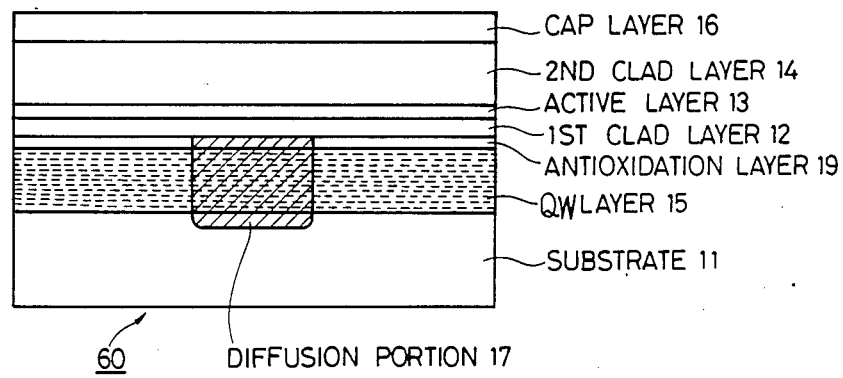
FIG. 15 is a cross-sectional view of a sixth embodiment of the present invention.

FIG. 15 shows a sixth embodiment of the present invention. A semiconductor laser 60 according to the sixth embodiment is characterized in that an antioxidation layer 19 is formed on a QW layer 15.

When Zn is directly diffused from above the QW layer 15, Al contained in the QW layer 15 comes up on the surface of the diffusion portion to form an Al oxidation film. It is hard to form a first clad layer 12 on such an Al oxidation film. Therefore, the semiconductor laser 60 according to the sixth embodiment is provided on the QW layer 15 with the antioxidation layer 19 formed by n-type GaAs in thickness of 0.1 μm.

The respective layers of the semiconductor laser 60 are identical in formation to those of the fifth embodiment.

Further, the sixth embodiment has the same characteristics as the fifth embodiment (first embodiment).

Embodiments 7 and 8

A semiconductor laser was produced as a seventh embodiment to be identical in structure and formation to the second embodiment except for that the Zn diffusion portion 17 was replaced by an injection portion formed by ion implantation of $Be^+$.

On the other hand, a semiconductor laser was produced as an eighth embodiment to be identical in structure and formation to the sixth embodiment except for that the Zn diffusion portion 17 was replaced by an injection portion formed by ion implantation of $Be^+$.

In each of these embodiments, ion implantation of $Be^+$ was performed in the following manner: Ion $Be^+$ was implanted in driving energy of 200 KeV and dose of $5 \times 10^{13}/cm^{-2}$ and then the layer was subjected to heat treatment at a temperature of 750° C. in an As atmosphere under As pressure of 7 to 10 Torr. for 10 minutes, in order to return crystalline quality broken by the ion implantation to its original state.

As the result, it has been confirmed that the portion obtained by $Be^+$ ion implantation has characteristics completely identical to those of the portion obtained by Zn diffusion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor laser:
   an active layer substantially oscillating laser beams;
   a first clad layer provided in contact with one principal surface of said active layer and being larger in band gap energy and smaller in optical refractive index than said active layer;
   a second clad layer provided in contact with the other principal surface of said active layer and being larger in band gap energy and smaller in optical refractive index than said active layer; and
   a quantum well (QW) layer contiguous to a surface of one of said first and second clad layers, the surface of said one clad layer contiguous to said QW layer being opposite the surface of said one clad layer which is in contact with said active layer, said QW layer being in quantum well structure and including a disordered Portion spaced from said active layer and a non-disordered portion.

2. A semiconductor laser in accordance with claim 1, wherein said clad layer contiguous to said QW layer is sufficiently thin to permit a beam generated from said active layer to penetrate into said clad layer.

3. A semiconductor laser in accordance with claim 2, wherein
   said active layer, said clad layers and said QW layer are formed by materials in the system of $Ga_{1-x}Al_xAs$ ($0 \leq x \leq 1$), and
   said thickness h of said one clad layer contiguous to said QW layer is selected within the range of $0.2 (\mu m) \leq h \leq 0.6 (\mu m)$.

4. In a semiconductor laser:
   a substrate of a first conductive type;
   a first clad layer of said first conductive type stacked on said substrate;
   an active layer stacked on said first clad layer and being smaller in band gap energy than said first clad layer;
   a second clad layer of a second conductive type stacked on said active layer and substantially identical in band gap energy to said first clad laycr;
   a QW layer of said first conductive type stacked on said second clad layer, said QW layer being formed by a plurality of alternately stacked first thin layers smaller in band gap energy than said active layer and second thin layers larger in band gap energy than said active layer; and
   a disordered portion of said second conductive type formed in a predetermined region of said QW layer and spaced from said active layer.

5. A semiconductor laser in accordance with claim 4, wherein
   said disordered portion comprises a diffusion portion formed by diffusion of impurities of said second conductive type.

6. A semiconductor laser in accordance with claim 4, wherein said disordered portion comprises an injection portion formed by implantation of impurities of said second conductive type.

7. A semiconductor laser in accordance with claim 4, wherein
further stacked on said QW layer is a cap layer of said second conductive type formed by a material capable of metal ohmic contact.

8. A semiconductor laser in accordance with claim 5, wherein
further stacked on said QW layer is a cap layer of said first conductive type formed by a material capable of metal ohmic contact,
said diffusion portion being formed from above said cap layer to extend across said cap layer and said QW layer.

9. A semiconductor laser in accordance with claim 6, wherein
further stacked on said QW layer is a cap layer of said first conductive type formed by a material capable of metal ohmic contact;
said injection portion being formed from above said cap layer to extend across said cap layer and said QW layer.

10. A semiconductor laser in accordance with claim 4, wherein
said second clad layer is sufficiently thin to permit a beam generated from said active layer to penetrate into said second clad layer.

11. A semiconductor laser in accordance with claim 10, wherein
said active layer, said clad layers and said QW layer are formed by materials in the systems of $Ga_{1-x}Al_xAs$ ($0 \leq x \leq 1$),
said first conductive type is an n-type and said second conductive type is a p-type, and
said thickness h of said one second clad layer is selected to be within the range of $0.2 \, (\mu m) \leq h \leq 0.6 \, (\mu m)$.

12. A semiconductor laser in accordance with claim 5, wherein
further including a protector layer provided between said second clad layer and said QW layer and formed by a material in which the speed of diffusion is slower than that in said second clad layer.

13. In a semiconductor laser:
a substrate of a first conductive type:
a QW layer of a second conductive type stacked on said substrate and formed by a plurality of alternately stacked first thin layers relatively small in band gap energy and second thin layers relatively large in band gap energy;
a first clad layer of said first conductive type stacked on said QW layer;
an active layer stacked on said first clad layer and having a band gap energy smaller than that of said first clad layer, larger than that of said first thin layers of said QW layer and smaller than that of said second thin layers of said QW layer;
a second clad layer of a second conductive type stacked on said active layer and being substantially identical in band gap energy to said first clad layer; and
a disordered portion of said first conductive type formed in predefined region of said QW layer and spaced from said active layer.

14. A sericonductor laser in accordance with claim 13, wherein
said disordered portion is a diffusion portion formed by diffusion of impurities of said first conductive type.

15. A semiconductor laser in accordance with claim 13, wherein
said disordered portion is an injection portion formed by implantation of impurities of said first conductive type.

16. A semiconductor laser in accordance with claim 13, wherein
said first clad layer is sufficiently thin to permit a beam generated from said active layer to penetrate into said first clad layer.

17. A semiconductor laser in accordance with claim 16, wherein
said active layer, said clad layers and said QW layer are formed by materials in the system of $Ga_{1-x}Al_xAs$ ($0 \leq x \leq 1$),
said first conductive type is a p-type and second conductive type is an n-type, and
said thickness h of said first clad layer is selected to be within the range of $0.2 \, (\mu m) \leq h \leq 0.6 \, (\mu m)$.

18. A semiconductor laser in accordance with claim 17, further including an antioxidation layer provided between said QW layer and said first clad layer and formed by n-type GaAs, said antioxidation layer being sufficiently thin to permit a beam generated from said active layer to penetrate into said antioxidation layer.

* * * * *